(12) United States Patent
Grieser-Schmitz

(10) Patent No.: US 8,972,104 B2
(45) Date of Patent: Mar. 3, 2015

(54) ELECTRICAL CONTROL UNIT FOR A VEHICLE ACTUATION SYSTEM

(75) Inventor: Stefan Grieser-Schmitz, Koblenz (DE)

(73) Assignee: Lucas Automotive GmbH, Koblenz (DE)

( * ) Notice: Subject to any disclaimer, the term of this patent is extended or adjusted under 35 U.S.C. 154(b) by 55 days.

(21) Appl. No.: 13/517,640

(22) Filed: Jun. 14, 2012

(65) Prior Publication Data

US 2012/0323436 A1 Dec. 20, 2012

(30) Foreign Application Priority Data

Jun. 15, 2011 (EP) .................................... 11004904

(51) Int. Cl.

| | |
|---|---|
| G06F 11/30 | (2006.01) |
| G07C 5/00 | (2006.01) |
| G01M 17/00 | (2006.01) |
| G06F 17/00 | (2006.01) |
| G06F 19/00 | (2011.01) |
| B60T 13/66 | (2006.01) |
| G01R 31/06 | (2006.01) |
| G01R 31/28 | (2006.01) |

(52) U.S. Cl.
CPC ............... *B60T 13/66* (2013.01); *B60T 13/662* (2013.01); *G01R 31/06* (2013.01); *G01R 31/2829* (2013.01)
USPC ....... 701/34.4; 701/29.1; 701/31.9; 701/33.7; 701/36

(58) Field of Classification Search
CPC ....... B60T 13/741; B60T 13/74; B60T 13/58; B60T 13/66; G01R 31/06; G01R 31/2829; G01R 31/34; G01R 35/005; H02P 8/38; H02P 6/00; H02P 6/08; H02P 25/08
USPC .......... 701/34.4, 75, 76, 70, 36, 22, 50, 19, 2, 701/29.1; 318/609, 29; 330/297; 180/422, 180/65.275, 206.4
See application file for complete search history.

(56) References Cited

U.S. PATENT DOCUMENTS

| | | | |
|---|---|---|---|
| 5,126,942 A * | 6/1992 | Matsuda ......................... | 701/75 |
| 5,539,320 A | 7/1996 | Vetter et al. | |
| 5,945,853 A | 8/1999 | Sano | |
| 6,317,675 B1 * | 11/2001 | Stolzl et al. ..................... | 701/76 |
| 6,469,858 B1 * | 10/2002 | Tsuyuguchi ................ | 360/73.03 |
| 6,489,693 B1 * | 12/2002 | Hetzler ......................... | 307/10.1 |
| 2003/0119628 A1 * | 6/2003 | Jager et al. ..................... | 477/71 |
| 2004/0212250 A1 * | 10/2004 | Yokoyama et al. ...... | 303/122.04 |
| 2005/0067996 A1 * | 3/2005 | Eba .............................. | 318/609 |
| 2007/0235006 A1 * | 10/2007 | Nishigaki et al. .......... | 123/339.1 |

(Continued)

FOREIGN PATENT DOCUMENTS

| | | |
|---|---|---|
| DE | 19908635 A1 | 9/2000 |
| DE | 102006041266 A1 | 3/2008 |

*Primary Examiner* — Calvin Cheung
*Assistant Examiner* — Luis A Martinez Borrero
(74) *Attorney, Agent, or Firm* — MacMillan, Sobanski & Todd, LLC

(57) ABSTRACT

An electrical control unit, or ECU, for a vehicle actuation system is described. The electrical control unit determines a current consumption of a current controlled actuator and comprises an input to receive an input signal from the current controlled actuator, an adder to add a bias signal to the input signal, an amplifier to generate an amplified signal by amplifying the signal output by the adder, a subtractor to subtract a signal representative of the bias signal from the amplified signal, and a determining unit to determine the current consumption from the signal output by the subtractor.

18 Claims, 3 Drawing Sheets

(56) References Cited

U.S. PATENT DOCUMENTS

| | | | |
|---|---|---|---|
| 2007/0242557 A1* | 10/2007 | Ozawa et al. | 365/233.5 |
| 2007/0244618 A1* | 10/2007 | Phillips | 701/70 |
| 2008/0059023 A1* | 3/2008 | Ueno et al. | 701/36 |
| 2008/0275617 A1* | 11/2008 | Kirmess et al. | 701/76 |
| 2010/0165682 A1* | 7/2010 | Sakakibara | 363/126 |
| 2010/0207754 A1* | 8/2010 | Shostak et al. | 340/450 |
| 2011/0066292 A1* | 3/2011 | Moriya et al. | 700/280 |
| 2011/0106408 A1* | 5/2011 | Morimoto et al. | 701/103 |
| 2011/0221533 A1* | 9/2011 | Lesso | 330/297 |
| 2012/0086382 A1* | 4/2012 | Peto | 318/729 |

* cited by examiner

ELECTRICAL CONTROL UNIT FOR A VEHICLE ACTUATION SYSTEM

CROSS-REFERENCE TO RELATED APPLICATIONS

This application claims priority to European Patent Application No. 11 004 904.6 filed Jun. 15, 2011, the disclosures of which are incorporated herein by reference.

BACKGROUND OF THE INVENTION

The present disclosure generally relates to an electrical control unit for an actuation system of a vehicle. Specifically, the disclosure relates to an electrical control unit configured to determine a current consumption of a current controlled actuator in a vehicle.

From U.S. Pat. No. 6,394,235 B1 a hydraulic vehicle brake with an electro mechanical brake actuator is known. The electro mechanical brake actuator is activated to generate a clamping force in a parking brake mode and comprises an electric motor connected to a spindle/nut arrangement.

U.S. Pat. No. 6,394,235 B1 teaches for the purpose of determining the clamping force to measure the speed and current consumption of the electric motor as a function of time. When in an initial actuation phase a sudden speed drop and an associated increase in current consumption occur, the nut of the spindle/nut arrangement has come into abutment with a brake piston. The values of speed and current consumption measured before the speed drop and the increase in current consumption, respectively, are stored in a memory as reference values. The spindle is then further rotationally driven by the electric motor until the continued measurement of the current consumption shows that a previously defined maximum value of the current consumption has been reached, which corresponds to a desired clamping force.

When the parking brake is released again, the momentary speed and momentary current consumption of the electric motor are compared with the corresponding reference values which have previously been stored. The point of time in which the momentary speed and the momentary current consumption are identical with the corresponding reference values is sensed, in order to set a desired distance between a nut of the spindle/nut arrangement and a brake piston.

The use of the current consumption of the electric motor as an indication for the prevailing clamping force requires a high measurement accuracy. Conventional current measurement circuits have several drawbacks in this respect. As an example, amplification errors and analog-to-digital conversion (ADC) errors may occur in the measurement circuit and degrade the resulting signal representative of the current consumption of the brake actuator. Moreover, leakage currents or offset voltages of an amplifier or an ADC circuit will appear over the lifetime of the circuit. Since the current consumption may be interpreted to correspond to the clamping force, the brake force of the vehicle brake cannot be precisely determined.

BRIEF SUMMARY OF THE INVENTION

The underlying object is to increase the measurement accuracy for the actuator current in an actuation system of a vehicle.

According to one aspect, an electrical control unit, or ECU, for an actuation system of a vehicle is provided. The ECU is configured to determine a current consumption of a current controlled actuator and comprises an input configured to receive an input signal from the current controlled actuator, an adder configured to add a bias signal to the input signal, an amplifier configured to generate an amplified signal by amplifying the signal output by the adder, a subtractor configured to subtract a signal representative of the bias signal (e.g., the bias signal itself or a signal derived therefrom) from the amplified signal, and a determining unit configured to determine the current consumption from the signal output by the subtractor.

In the aspect described above, the determining unit may further be configured to determine an actuating force (e.g., a clamping force in case of a brake actuator) based on the current consumption. The determination may be based on the concept described in U.S. Pat. No. 6,394,235 B1 or any other concept. The current consumption may also be determined for other purposes, such as for evaluating the operability of a current controlled actuator, such as a brake actuator, a steering actuator or an actuator for electric windows.

A signal level of the bias signal may be selected to compensate for signal artifacts (e.g., circuit-specific contributions) degrading the determination of the current consumption for certain input signal levels (e.g., close to zero volt). The bias signal level may be selected so as to eliminate at least one of amplification and ADC errors, in particular for low input signal levels.

In one implementation, the bias signal may be selected as a function of the input signal. The bias signal may be (e.g., two to ten times) higher than the input signal at low input signal levels. Alternatively, or in addition, the adder can be configured to selectively add the bias signal to a low level input signal. The bias signal level can be set to or approximate zero at high input signal levels. Moreover, the adder may be configured to add the bias signal to the input signal only when the input signal is substantially equal to or smaller than a threshold value.

In the aspect described above, the electrical control unit may further comprise at least one analog/digital converter configured to convert the amplified signal output by the amplifier into a first digital signal, and to convert the bias signal into a second digital signal, wherein the subtractor may be configured to subtract the second digital signal from the first digital signal to output a digital output signal. In one realization, the electrical control unit comprises a first analog/digital converter configured to convert the amplified signal and a second analog/digital converter configured to convert the bias signal.

The electrical control unit may comprise at least one scaling unit configured to scale one or both of the input signal and the bias signal, wherein the at least one scaling unit is arranged in a signal flow direction before the adder. For instance, the electrical control unit may have a first scaling unit configured to scale the input signal, and a second scaling unit configured to scale the bias signal. In this case, the input signal and the bias signal are scaled before the summation thereof by the adder.

The electrical control unit may also comprise a calibration unit configured to determine a compensation signal representative of the signal output by the subtractor when no input signal is present. The calibration unit may be configured to repeatedly (e.g., periodically or non-periodically) determine the compensation signal. The determining unit may further be configured to apply the compensation signal to the signal output by the subtractor. In this case, the determining unit may for example be configured to add or to subtract the compensation signal from the signal output by the subtractor.

The electrical control unit may further comprise a source for providing the bias signal. The source may be controllable based on the input signal level (e.g., so as to adjust the bias signal dependent on the input signal level).

Further, the amplifier may be configured to amplify the signal output by the adder by an amplification factor that depends on one or more of the input signal, the bias signal and the signal output by the adder. The amplifier may include at least one operational amplifier. The at least one operational amplifier may have inverting and non-inverting inputs, and an output. The resulting signal of the adder may be applied to the non-inverting input of the operational amplifier.

According to a further aspect, there is provided an actuating system including a current controlled actuator and an electrical control unit, or ECU, configured to determine a current consumption of the current controlled actuator and comprising an input configured to receive an input signal from the current controlled actuator, an adder configured to add a bias signal to the input signal, an amplifier configured to generate an amplified signal by amplifying the signal output by the adder, a subtractor configured to subtract a signal representative of the bias signal from the amplified signal, and a determining unit configured to determine the current consumption from the signal output by the subtractor.

In the aspect described above, the current controlled actuator may be configured to actuate a vehicle brake. As an example, the actuator may be configured to actuate at least one of a parking brake and a service brake. In addition, or as an alternative, the actuator may be operated in a brake-by-wire mode of an electro hydraulic service brake. The actuator may alternatively be configured to actuate a vehicle window or a steering system.

According to a still further aspect, there is provided a method for determining a current consumption of a current controlled actuator, the method comprising the steps of receiving an input signal from the current controlled actuator, adding a bias signal to the input signal, amplifying the sum of the input signal and the bias signal and outputting an amplified signal, subtracting a signal representative of the bias signal (or the bias signal) from the amplified signal, and determining the current consumption of the current controlled actuator from the result of the subtraction.

The method may further comprise determining an actuation force based on the current consumption. The method may comprise converting the amplified signal into a first digital signal, and converting the bias signal into a second digital signal, wherein the second digital signal is subtracted from the first digital signal. The method may also comprise scaling at least one of the input signal and the bias signal before adding the bias signal to the input signal. In one implementation, the bias signal may be added to the input signal or may be generated only when the input signal is substantially equal to or smaller than a threshold value.

The method may comprise determining a compensation signal representative of the result of the subtraction when no input signal is present. The determination of the compensation signal may be performed repeatedly. The method may further comprise applying the compensation signal to the result of the subtraction. In one implementation, the method may comprise adding or subtracting the compensation signal from the result of the subtraction.

According to a further aspect, there is provided a computer program product for determining a current consumption of a current controlled actuator, the computer program product comprising program code portions for performing, when executed in an electronic control unit, or ECU, the steps of receiving an input signal from the current controlled actuator, adding a bias signal to the input signal, amplifying the sum of the input signal and the bias signal and outputting an amplified signal, subtracting a signal representative of the bias signal from the amplified signal, and determining the current consumption of the current controlled actuator from the result of the subtraction.

The computer program product may be executed by appropriate data processing means, microprocessors or the like. The computer program product may be stored on a computer readable medium or memory components, such as a ROM, a FLASH-ROM, an EEPROM or a non-volatile memory chip to be accessed by the data processing means or microprocessor, on a data carrier, like a CD-ROM, DVD, SmartCard, exchangeable FLASH-card, or in external devices, servers or the like, so that the computer program product may be downloaded to the electrical control unit, for example via a network, a vehicle bus or a suitable communication link. The computer program product may be implemented as a software routine or software tool to be executed by the data processing means or microprocessor.

Other advantages of this invention will become apparent to those skilled in the art from the following detailed description of the preferred embodiments, when read in light of the accompanying drawings.

DETAILED DESCRIPTION OF THE INVENTION

Figure 1:
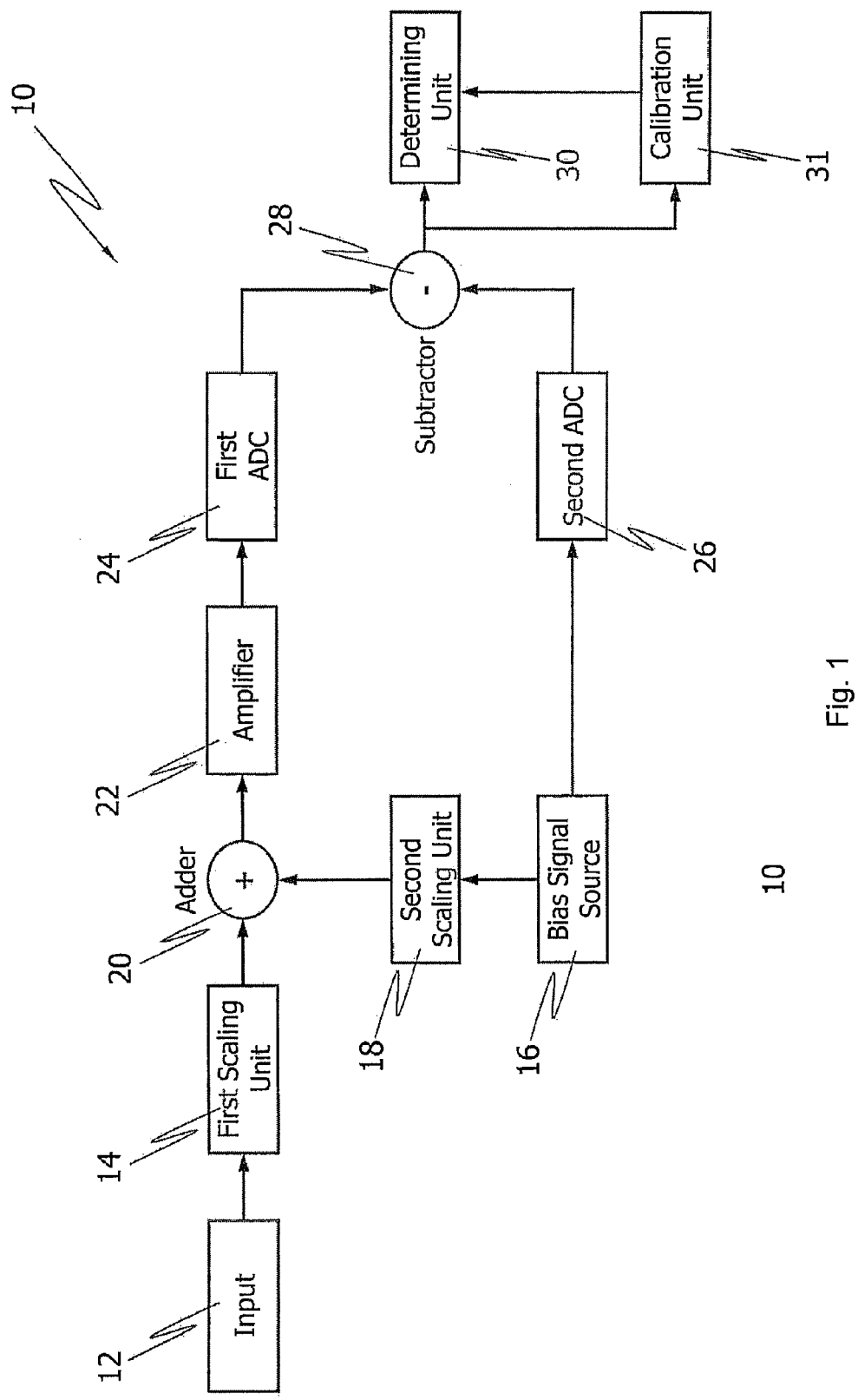
FIG. 1 is a block diagram showing an embodiment of an electrical control unit.

Referring to FIG. 1, there is shown a block diagram of an embodiment of an electrical control unit 10, or ECU, for an actuation system of a vehicle (not shown in FIG. 1). The ECU 10 is configured to determine a current consumption of an electro mechanical actuator included in the actuation system.

The electrical control unit 10 includes an input 12 (e.g., an electric terminal) to receive an input signal, such as an input voltage, from the actuator. Further, the electrical control unit 10 includes a scaler which in the present embodiment is provided in the form of a first scaling unit 14 and a second scaling unit 18. The input 12 is connected to the first scaling unit 14 which scales the input signal applied to the input 12. The electrical control unit 10 further comprises a bias signal source 16 which provides a bias signal. The bias signal is provided to the second scaling unit 18 that scales the bias signal.

The electrical control unit 10 also includes an adder 20 which adds the scaled bias signal output by the second scaling unit 18 and the scaled input signal output by the first scaling unit 14. In other words, the scaled input signal and the scaled bias signal are summed up by the adder 20. Thus, the scaling unit 18 is arranged in a signal flow direction before the adder.

Further, the electrical control unit 10 has an amplifier 22 (e.g., an operational amplifier) which generates an amplified signal by amplifying the signal output by the adder 20. The amplification factor of the amplifier 22 may depend on at least one of the input signal, the bias signal and the signal output by the adder 20. In case that the input signal is a low level input signal, the adder 20 may add the scaled bias signal to the scaled input signal only when the input signal is substantially equal to or smaller than a threshold value. Additionally, or as an alternative, the signal level of the bias signal as provided by the bias signal source 16 may depend on the signal level of the input signal.

As shown in FIG. 1, the electrical control unit 10 includes an analog/digital converter which is here divided in a first analog/digital converter 24 and a second analog/digital converter 26. The first analog/digital converter 24, or first ADC, converts the amplified signal output by the amplifier 22 into a first digital signal. The second analog/digital converter 26, or second ADC, is connected to the bias signal source 16 and converts the bias signal therefrom into a second digital signal. The electrical control unit 10 further comprises a subtractor 28 which subtracts the second digital signal of the second analog/digital converter 26 from the first digital signal of the first analog/digital converter 24 to output a digital output signal. In other words, the digitalized amplified signal and the digitalized bias signal are fed to the subtractor 28 which then subtracts the signal representative of the bias signal from the amplified signal to reconstruct the original input signal.

As further shown from FIG. 1, the electrical control unit 10 includes a determining unit 30 which is connected to the subtractor 28. The signal output by the subtractor 28 is fed to the determining unit 30 which then determines the current consumption of the actuator from the signal output by the subtractor. Based on the determined current consumption, the determining unit 30 determines an actuation force that results from activation of the actuator.

The electrical control unit 10 includes a calibration unit 31 that determines a compensation signal representative of the signal output by the subtractor 28 when no input signal is present. When the input signal is, for example, at zero volt, an amplifier output value representing the bias signal is expected. A deviation from the expected value is used to calculate the compensation signal. The determining unit 30 may add or subtract this determined compensation signal from the signal output by the subtractor 28 to eliminate errors by offset voltages or leakage currents in the signal path. Further, the calibration unit 31 can determine the compensation signal repeatedly. Thus, the calibration procedure or routine may be performed periodically or non-periodically.

Figure 2:
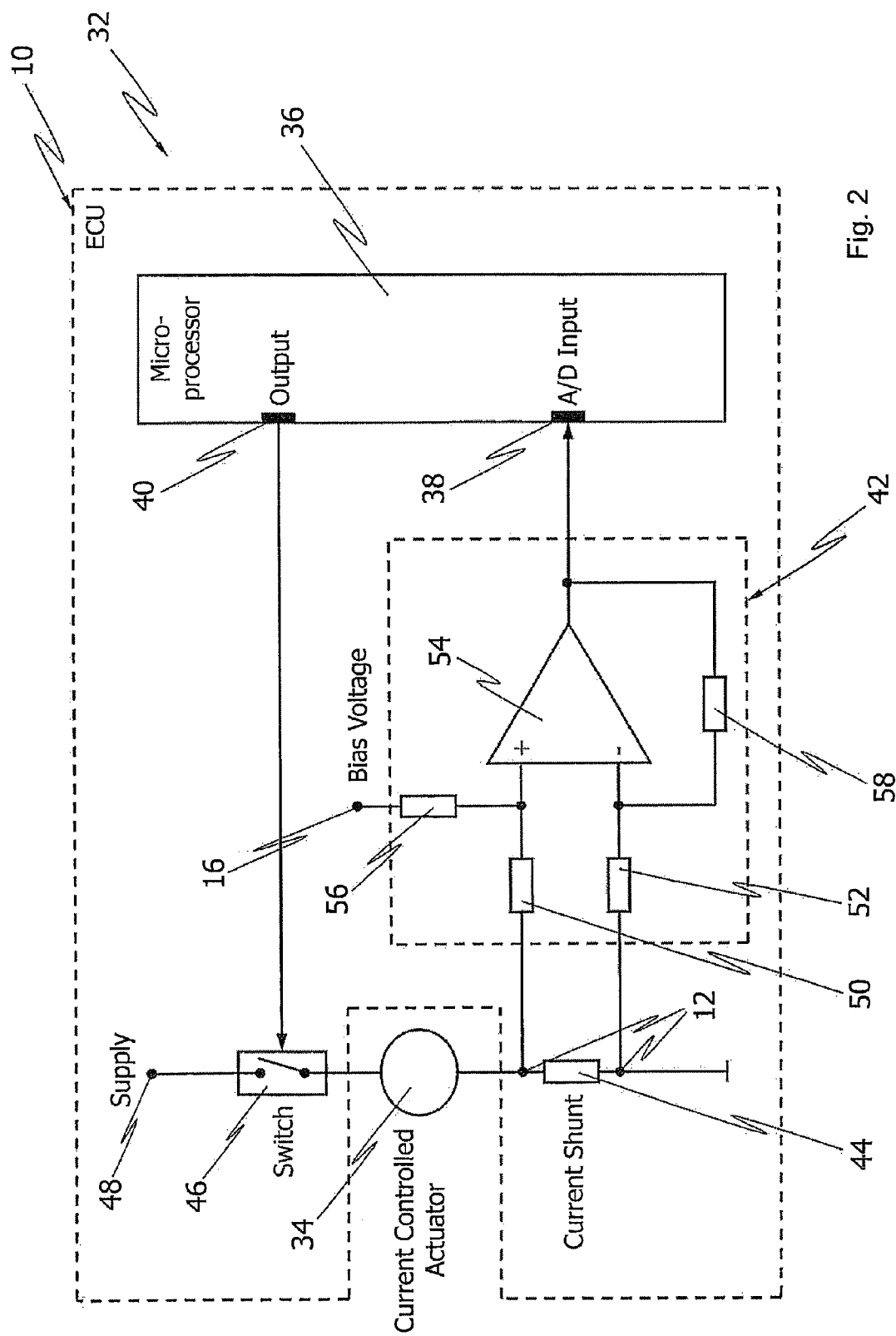
FIG. 2 shows an exemplary electro mechanical brake actuation system comprising the electrical control unit embodiment shown in FIG. 1.

FIG. 2 illustrates an embodiment of an electro mechanical brake actuation system 32 including the electrical control unit 10 shown in FIG. 1 and an electro mechanical brake actuator 34. The brake actuator 34 comprises, for example, an electrical motor and a gear stage as illustrated in U.S. Pat. No. 6,394,235 B1.

The electrical control unit 10 includes a microprocessor 36 having an analog/digital conversion input 38 and an output 40. In the embodiment of FIG. 2, the microprocessor 36 realizes the analog/digital converter, the subtractor, the determining unit and the calibration unit as described above with reference to FIG. 1.

The electrical control unit 10 further includes an adder and amplifier circuit 42. The adder and amplifier circuit 42 realizes the scaling unit, the adder and the amplifier as described above with reference to FIG. 1. Further, the bias voltage source 16 of the electrical control unit 10 is connected to the adder and amplifier circuit 42. The adder and amplifier circuit 42 has an input for receiving an input signal and an output which is connected to the analog/digital input 38 of the microprocessor 36. The adder and amplifier circuit 42 is connected to the input 12 of the electrical control unit 10. The input 12 taps the input signal from a current shunt 44 which is connected with one of its terminals to one of the connection lines of the brake actuator 34. The other terminal of the current shunt 44 is connected to ground.

As further shown in FIG. 2, the electrical control unit 10 includes a switch 46 which is connected with one of its terminals to the other connection line of the brake actuator 34 and with its other terminal with an voltage supply source 48 (e.g., with a vehicle battery). The switch 46 may be a transistor which is switched based on the output signal output by the output 40 of the microprocessor 36. One or more of the components illustrated in FIG. 2 may be realized in the form of an Application Specific Integrated Circuit (ASIC).

Now the measurement process is described in more detail for the embodiment illustrated in FIG. 2. The input 12 taps the input signal in form of a voltage signal from the current shunt 44 and applies the input signal to the adder and amplifier circuit 42. Thus, an input signal from the brake actuator 34 is received. The input signal is then scaled by resistors 50 and 52. The resistors 50 and 52 may have values between 1 kΩ and 10 kΩ. In the embodiment of FIG. 2, the resistor 50 has a value of 1 kΩ and the resistor 52 has a value of 1 kΩ. The adder and amplifier circuit 42 includes an operational amplifier 54 having a inverting and non-inverting inputs and an output. One of the terminals of the input 12 is connected via the resistor 50 to the non-inverting input of the operational amplifier 54. Further, also the bias signal source 16 is connected via a resistor 56 to the non-inverting input of the operational amplifier 54. The resistor 56 may have a value between 10 kΩ and 100 kΩ, and is in the embodiment of FIG. 2 selected to be of 20 kΩ. The other connection line of the input 12 is connected via the resistor 52 to the inverting input of the operational amplifier 54. Thus, the input signal is scaled by the resistors 50 and 52 and the bias signal is scaled by resistor 56 before adding the bias signal to the input signal.

Since the errors of amplification and analog to digital conversion are greater when the input signal or input voltage is close to zero, the bias signal (or the signal representative thereof) is added to the input signal only when the input signal is substantially equal to or smaller than a threshold value. Additionally, or as an alternative, the signal level of the bias signal may depend on the signal level of the input signal.

The (amplified) output signal of the operational amplifier 54 is on the one hand fed back via a resistor 58 to the inverting input of the operational amplifier 54, and on the other hand supplied to the analog/digital input 38 of the microprocessor 36. The resistor 58 may have a value between 10 kΩ and 100 kΩ, and is in the embodiment of FIG. 2 selected to be of 20 kΩ. The microprocessor 36 converts the amplified signal from the adder and amplifier circuit 42 into a first digital signal, and the bias signal from the bias signal source 16 into a second digital signal. Then, the second digital signal is subtracted from the first digital signal to obtain a subtracted result. Based on the result of the subtraction, the microprocessor 36 determines the current consumption of the brake actuator 34. Since in the embodiment of FIG. 2 the values of the resistor pairs 50, 56 and 52, 58 are identical, a symmetrical circuit design is achieved, with a gain factor of generally between 10 and 100. In the specific embodiment of FIG. 2 the gain factor is 20.

The microprocessor 36 further includes the calibration unit as generally described above with reference to FIG. 1 to determine a compensation signal representative of the result of the subtraction when no input signal is present. The determination of this compensation signal is performed repeatedly, e.g., periodically or non-periodically. When the input signal is at zero volt, an amplifier output value representing the bias voltage is expected and output by the adder and amplifier circuit 42. The deviation from the expected value is used to determine the compensation signal. The microprocessor 36 then applies (e.g., adds or subtracts) the compensation signal to the result of the subtraction in subsequent determination routines to eliminate errors by offset voltages or leakage currents in the signal path.

Figure 3:
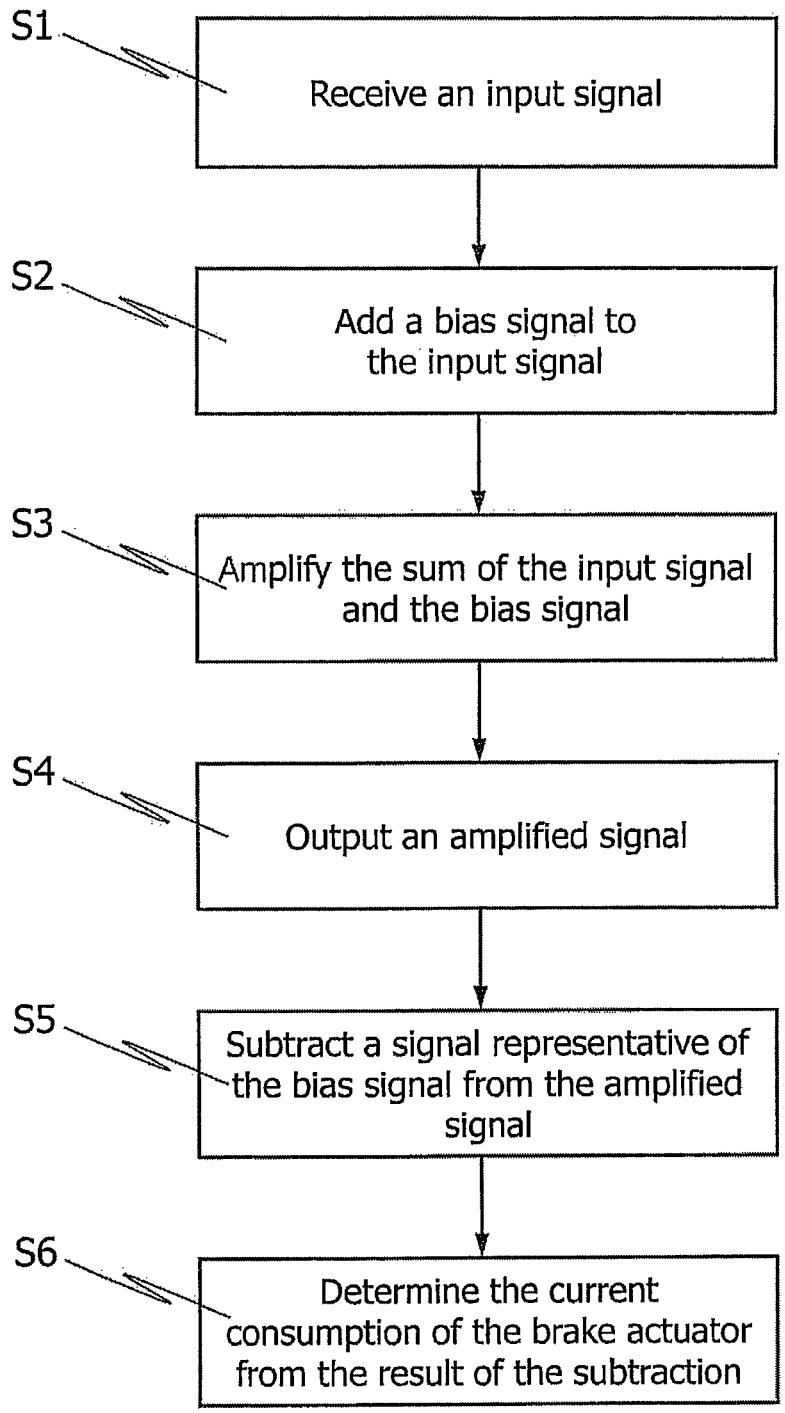
FIG. 3 illustrates a flow chart of a method for determining a current consumption of an electro mechanical brake actuator of the brake actuation system shown in FIG. 2.

FIG. 3 illustrates a flow chart of a method embodiment for determining the current consumption of the electro mechanical brake actuator 34 of the brake actuation system 32 as shown in FIG. 2. When an input signal from the brake actuator 34 is received (Step S1), the measurement circuit shown in FIG. 2 adds a bias signal to the input signal (Step S2), amplifies the sum of the input signal and the bias signal (Step S3) and outputs an amplified signal (Step S4). Then, the microprocessor 36 subtracts the bias signal (or a signal representative of the bias signal) from the amplified signal (Step S5) and determines the current consumption of the brake actuator 34 from the result of the subtraction (Step S6). Based on the current consumption, the microprocessor 36 may determine a clamping force generated by the brake actuator 34, for example as described in U.S. Pat. No. 6,394,235 B1. The clamping force thus determined may be used to control the brake actuator via the switch 46.

Since the bias signal (e.g., a variable or fixed bias voltage) is added to the input signal before the amplification, and since the bias signal will be subtracted again after the amplification and the analog to digital conversion of the combined signal (sum of the input signal and the bias signal), amplification errors and/or analog to digital conversion errors in particular when the input signal is close to zero are eliminated. Further, a repeated (re-)calibration as described above of an amplifier circuit and/or an analog to digital converter circuit can compensate the impact of, for example, offset voltages or leakage currents in the signal path which will appear during lifetime of the circuit. Thus, the accuracy of the measurement circuit (e.g., low-level voltage measurement) for the current consumption of an electro mechanical brake actuator of a vehicle brake system, such as an electrical park brake, is increased and an adequate compensation of voltage drifts caused by temperature or aging effects is achieved. Consequently, since the current consumption may in certain applications be interpreted to correspond to the clamping force, the brake force of the vehicle brake system can be more precisely determined as well.

While the above embodiment has exemplarily been described in relation to a vehicle brake system such as an electrical park brake, it will readily be apparent that the technique presented herein can also be implemented in combination with other types of vehicle actuation systems, such as brake-by-wire based electro hydraulic vehicle brakes or brake systems having other brake actuators, as well as other types of vehicle systems such as steering systems. Accordingly, the present disclosure is not limited to any type of vehicle actuation system.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope.

What is claimed is:

1. An electrical control unit configured to determine a current consumption of a current controlled actuator in a vehicle and comprising:
    an input configured to receive an input signal that is indicative of a current consumption from a current controlled actuator;
    an adder configured to add a bias signal that is representative of a bias voltage to the input signal and to output a summation signal;
    an amplifier configured to generate an amplified signal by amplifying the summation signal output by the adder;
    a subtractor configured to subtract a signal representative of the bias signal from the amplified signal to reconstruct a signal indicative of the input signal; and
    a determining unit configured to determine the current consumption of the current controlled actuator from the signal output by the subtractor.

2. The electrical control unit according to claim 1, wherein the determining unit is further configured to determine an actuation force based on the current consumption.

3. The electrical control unit according to claim 1, wherein a signal level of the bias signal is selected to compensate for signal artifacts degrading the determination of current consumption for low input signal levels.

4. The electrical control unit according to claim 3, wherein the bias signal is selected as a function of the input signal.

5. The electrical control unit according to claim 1, wherein the adder is configured to add the bias signal to at least one of a low level input signal and the input signal only when the input signal is substantially equal to or smaller than a threshold value.

6. The electrical control unit according to claim 1, further comprising at least one analog/digital converter configured to convert the amplified signal output by the amplifier into a first digital signal, and to convert the bias signal into a second digital signal, wherein the subtractor is configured to subtract the second digital signal from the first digital signal to output a digital output signal.

7. The electrical control unit according to claim 1, further comprising at least one scaling unit configured to scale one or both of the input signal and the bias signal, wherein the at least one scaling unit is arranged in a signal flow direction before the adder.

8. The electrical control unit according to claim 1, further comprising a calibration unit configured to determine a compensation signal representative of the signal output by the subtractor when no input signal is present.

9. The electrical control unit according to claim 8, wherein the calibration unit is configured to repeatedly determine the compensation signal.

10. The electrical control unit according to claim 8, wherein the determining unit is configured to apply the compensation signal to the signal output by the subtractor.

11. The electrical control unit according to claim 1, wherein the combination of the electrical control unit and the current controlled actuator define an actuation system.

12. The electrical control unit of claim 11, wherein the current controlled actuator is configured to actuate a vehicle brake.

13. The electrical control unit according to claim 1 further including:
    a computer program product for determining the current consumption of the current controlled actuator, the computer program product comprising program code portions for, when executed in the electric control unit performing the steps of:
    receiving the input signal from the current controlled actuator;
    adding the bias signal to the input signal;
    amplifying the sum of the input signal and the bias signal and outputting the amplified signal;
    subtracting the signal representative of the bias signal from the amplified signal; and
    determining the current consumption of the current controlled actuator from the result of the subtraction.

14. A method for operation of an electrical control unit for determining a current consumption of a current controlled actuator in a vehicle, the method comprising the steps of:
- receiving an input signal that is indicative of a current consumption from a current controlled actuator;
- adding a bias signal that is representative of a bias voltage to the input signal;
- amplifying the sum of the input signal and the bias signal and outputting an amplified signal;
- subtracting a signal representative of the bias signal from the amplified signal to reconstruct a signal indicative of the input signal; and
- determining the current consumption of the current controlled actuator from the result of the subtraction.

15. The method according to claim 14, further comprising determining an actuation force based on the current consumption.

16. The method according to claim 14, further comprising converting the amplified signal into a first digital signal, and converting the bias signal into a second digital signal, wherein the second digital signal is subtracted from the first digital signal.

17. The method according to claim 14, wherein the bias signal is added to the input signal or generated only when the input signal is substantially equal to or smaller than a threshold value.

18. The method according to claim 14, further comprising determining a compensation signal representative of the result of the subtraction when no input signal is present.

* * * * *